(12) United States Patent
Shimizu et al.

(10) Patent No.: US 9,114,613 B2
(45) Date of Patent: Aug. 25, 2015

(54) LIQUID-EJECTING HEAD, LIQUID-EJECTING APPARATUS, AND PIEZOELECTRIC DEVICE

(71) Applicant: SEIKO EPSON CORPORATION, Tokyo (JP)

(72) Inventors: Toshihiro Shimizu, Fujimi-machi (JP); Hiroshi Ito, Suwa (JP); Jiro Kato, Suwa (JP); Eiju Hirai, Minami minowa-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/546,595

(22) Filed: Nov. 18, 2014

(65) Prior Publication Data

US 2015/0077476 A1 Mar. 19, 2015

Related U.S. Application Data

(63) Continuation of application No. 14/132,677, filed on Dec. 18, 2013, now Pat. No. 8,926,070, which is a continuation of application No. 13/094,490, filed on Apr. 26, 2011, now Pat. No. 8,721,055.

(30) Foreign Application Priority Data

Apr. 27, 2010 (JP) ................................ 2010-101925

(51) Int. Cl.
| | | |
|---|---|---|
| *B41J 2/045* | (2006.01) | |
| *B41J 2/14* | (2006.01) | |
| *H01L 41/047* | (2006.01) | |
| *B41J 2/16* | (2006.01) | |

(Continued)

(52) U.S. Cl.
CPC .............. *B41J 2/14233* (2013.01); *B41J 2/045* (2013.01); *B41J 2/161* (2013.01); *B41J 2/1629* (2013.01); *B41J 2/1631* (2013.01); *B41J 2/1634* (2013.01); *B41J 2/1642* (2013.01); *B41J 2/1646* (2013.01); *H01L 41/047* (2013.01); *H01L 41/0475* (2013.01); *H01L 41/0477* (2013.01); *B41J 2/1623* (2013.01); *B41J 2002/14241* (2013.01); *B41J 2002/14419* (2013.01); *B41J 2002/14491* (2013.01); *H01L 27/20* (2013.01); *H01L 41/0973* (2013.01)

(58) Field of Classification Search
None
See application file for complete search history.

(56) References Cited

U.S. PATENT DOCUMENTS

| | | |
|---|---|---|
| 6,764,167 B2 | 7/2004 | Shimada et al. |
| 6,869,170 B2 | 3/2005 | Shimada et al. |

(Continued)

FOREIGN PATENT DOCUMENTS

| | | |
|---|---|---|
| JP | 2002-120369 | 4/2002 |
| JP | 2008-284781 | 11/2008 |

(Continued)

OTHER PUBLICATIONS

Wikipedia Article: Titanium, see section Characteristics: Physical Properties.*

(Continued)

*Primary Examiner* — Lisa M Solomon
(74) *Attorney, Agent, or Firm* — Workman Nydegger

(57) ABSTRACT

There is provided a piezoelectric device comprising a first electrode, a piezoelectric layer that is formed above the first electrode, a second electrode that is formed above the piezoelectric layer and a coating layer that is formed above the second electrode consisting of tungsten or titanium.

3 Claims, 6 Drawing Sheets

(51) Int. Cl.
*H01L 27/20* (2006.01)
*H01L 41/09* (2006.01)

(56) References Cited

U.S. PATENT DOCUMENTS

| | | | |
|---|---|---|---|
| 7,364,273 B2* | 4/2008 | Takahashi | 347/68 |
| 7,637,600 B2 | 12/2009 | Yazaki | |
| 7,781,946 B2 | 8/2010 | Izumi et al. | |
| 8,201,926 B2 | 6/2012 | Shimada | |
| 2002/0051040 A1 | 5/2002 | Shimada et al. | |
| 2003/0020365 A1 | 1/2003 | Yamada et al. | |
| 2009/0219345 A1* | 9/2009 | Yazaki et al. | 347/68 |
| 2009/0284568 A1 | 11/2009 | Yazaki | |
| 2011/0234707 A1* | 9/2011 | Gao | 347/70 |

FOREIGN PATENT DOCUMENTS

| | | |
|---|---|---|
| JP | 2009-172878 | 8/2009 |
| JP | 2010-003971 | 1/2010 |

OTHER PUBLICATIONS

U.S. Appl. No. 14/132,677, Apr. 17, 2014, Office Action.
U.S. Appl. No. 14/132,677, Aug. 19, 2014, Notice of Allowance.
U.S. Appl. No. 13/094,490, Aug. 20, 2012, Office Action.
U.S. Appl. No. 13/094,490, Jun. 18, 2013, Office Action.
U.S. Appl. No. 13/094,490, Jan. 2, 2014, Notice of Allowance.

* cited by examiner

LIQUID-EJECTING HEAD, LIQUID-EJECTING APPARATUS, AND PIEZOELECTRIC DEVICE

CROSS-REFERENCE TO RELATED APPLICATIONS

This application is a Continuation of U.S. patent application Ser. No. 14/132,677 filed Dec. 18, 2013, which is expressly incorporated herein by reference in its entirety. U.S. patent application Ser. No. 14/132,677 is a Continuation of U.S. patent application Ser. No. 13/094,490 filed Apr. 26, 2011, (now U.S. Pat. No. 8,721,055), which is also expressly incorporated herein by reference in its entirety. U.S. patent application Ser. 13/094,490 claims the benefit of Japanese Patent Application No. 2010-101925, filed Apr. 27, 2010, which is also expressly incorporated herein by reference in its entirety.

BACKGROUND

1. Technical Field

The present invention relates to a liquid-ejecting head, a liquid-ejecting apparatus, and a piezoelectric device.

2. Related Art

A liquid-ejecting head is used as a component of a liquid-ejecting apparatus and is applied to, for example, an ink jet printer. In this case, the liquid-ejecting head is used to eject a droplet of ink, and the ejected droplet then flies. Accordingly, the ink jet printer can perform printing as a result of applying the ink onto a medium such as paper.

In general, in order to eject a liquid from a nozzle, the liquid-ejecting head has an actuator that applies pressure to the liquid. Some types of actuators have a configuration in which a piezoelectric layer made of a piezoelectric material, such as crystallized piezoelectric ceramic, that exhibits an electromechanical transduction function is disposed between two electrodes. The piezoelectric layer can be deformed as a result of application of voltage through the two electrodes, and such deformation can be utilized to bring the actuator into operation, for example, in a bending vibration mode.

In the actuator having such a configuration, a common upper electrode structure is known, in which a plurality of piezoelectric layers for piezoelectric devices are formed and in which an electrode (hereinafter also referred to as an "upper electrode") that covers the piezoelectric layers is formed so as to continuously overlie the plurality of piezoelectric devices (JP-A-2009-172878).

In the case where a piezoelectric device has a configuration in which the piezoelectric layer is disposed between a lower electrode and an upper electrode, the piezoelectric layer may have an active region and an inactive region, the active region being disposed between two electrodes, and the inactive region not being disposed between the two electrodes. In this case, in the deformation of the piezoelectric layer, strain of the active region is suppressed by the inactive region with the result that stress concentrates in the vicinity of a boundary between the active region and the inactive region.

Meanwhile, for the purpose of, for example, increasing an amount of a liquid ejected from the liquid-ejecting apparatus, the piezoelectric layer is required to be deformed in an increased amount. In the case where an amount of the deformation is increased, larger stress concentrates in the vicinity of the boundary between the active region and the inactive region, and cracking may occur, for example, in the piezoelectric layer.

SUMMARY

An advantage of some aspects of the invention is that it provides a liquid-ejecting head and a liquid-ejecting apparatus, the liquid-ejecting head having a piezoelectric layer in which cracking is less likely to occur and having good reliability. Furthermore, another advantage of some aspects of the invention is that it provides a piezoelectric device having a piezoelectric layer in which cracking is less likely to occur and having good reliability.

Embodiments of the invention are provided in order to overcome at least a part of the above disadvantages and have the following aspects or advantages.

According to a first aspect of the invention, there is provided a piezoelectric device including a first electrode, a piezoelectric layer that is formed so as to cover the first electrode, a second electrode that is formed on the piezoelectric layer, and a coating layer that is formed on the second electrode by using any one of tungsten and titanium. The first electrode and the second electrode form a rectangular overlap region in which the first electrode overlaps the second electrode in a plan view. The first electrode defines a long side of the overlap region. The second electrode defines a short side of the overlap region. The overlap region has a pair of first regions and has a second region, the pair of the first regions being positioned adjacent to a pair of the short sides, and the second region being positioned between the pair of the first regions, in a plan view. The coating layer is formed at least in the first regions so as to avoid the second region of the overlap region in a plan view.

In the liquid-ejection head having this advantageous configuration, the coating layer is formed in the vicinity of a boundary between the active region and inactive region of the piezoelectric layer of the piezoelectric device. By virtue of such a configuration, strain generated in the vicinity of the boundary between the active region and inactive region of the piezoelectric layer can be reduced during actuation of the piezoelectric device. Accordingly, the concentration of the stress generated in the vicinity of the boundary between the active region and the inactive region can be reduced, and cracking is therefore less likely to be caused in the piezoelectric layer. Consequently, the liquid-ejecting head having such a configuration exhibits increased reliability.

In the above advantageous configuration, it is preferable that the piezoelectric device has a lead electrode that is formed on the piezoelectric layer so as to be electrically connected to the first electrode and that a material used for the lead electrode is capable of containing nickel and chromium.

In the liquid-ejecting head having this advantageous configuration, galvanic corrosion is less likely to be caused in the lead electrode of the piezoelectric device during a production process. Namely, difference between standard electrode potential of nickel and chromium and standard electrode potential of tungsten and titanium is small, and galvanic corrosion is therefore less likely to be caused, for example, in wet-etching a coating layer made of tungsten or titanium.

In any of the above advantageous configurations, it is preferable that a material used for the second electrode is capable of primarily containing iridium.

In the liquid-ejecting head having this advantageous configuration, the second electrode exhibits good electrical conductivity and protects the piezoelectric layer.

According to a second aspect of the invention, there is provided a liquid-ejecting apparatus including the liquid-ejecting head having any of the above advantageous configurations.

The liquid-ejecting apparatus having this advantageous configuration includes the above liquid-ejecting head and therefore exhibits increased reliability.

According to a third aspect of the invention, there is provided a piezoelectric device having a first electrode, a piezoelectric layer that is formed so as to cover the first electrode, a second electrode that is formed on the piezoelectric layer, and a coating layer that is formed on the second electrode by using any one of tungsten and titanium. The first electrode and the second electrode form a rectangular overlap region in which the first electrode overlaps the second electrode in a plan view. The first electrode defines a long side of the overlap region. The second electrode defines a short side of the overlap region. The overlap region has a pair of first regions and has a second region, the pair of the first regions being positioned adjacent to a pair of the short sides, and the second region being positioned between the pair of the first regions, in a plan view. The coating layer is formed at least in the first region so as to avoid the second region of the overlap region in a plan view.

In the piezoelectric device having this advantageous configuration, the coating layer is formed in the vicinity of the boundary between the active region and inactive region of the piezoelectric layer. By virtue of such a configuration, in the case where an electric field is applied between the first electrode and the second electrode, strain generated in the vicinity of the boundary between active region and the inactive region of the piezoelectric layer can be reduced. Accordingly, the concentration of the stress generated in the vicinity of the boundary between the active region and the inactive region can be decreased, and cracking is therefore less likely to be caused in the piezoelectric layer. Consequently, the piezoelectric device has high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention will be hereinafter described with reference to the drawings. The following embodiments are employed to describe an example of embodiments of the invention. Accordingly, embodiments of the invention are not limited to the following embodiments and include various modifications without departing from the scope of the invention. Not all the configurations to be described with respect to the following embodiments are required elements of embodiments of the invention.

1. Liquid-Ejecting Head

Figure 1:
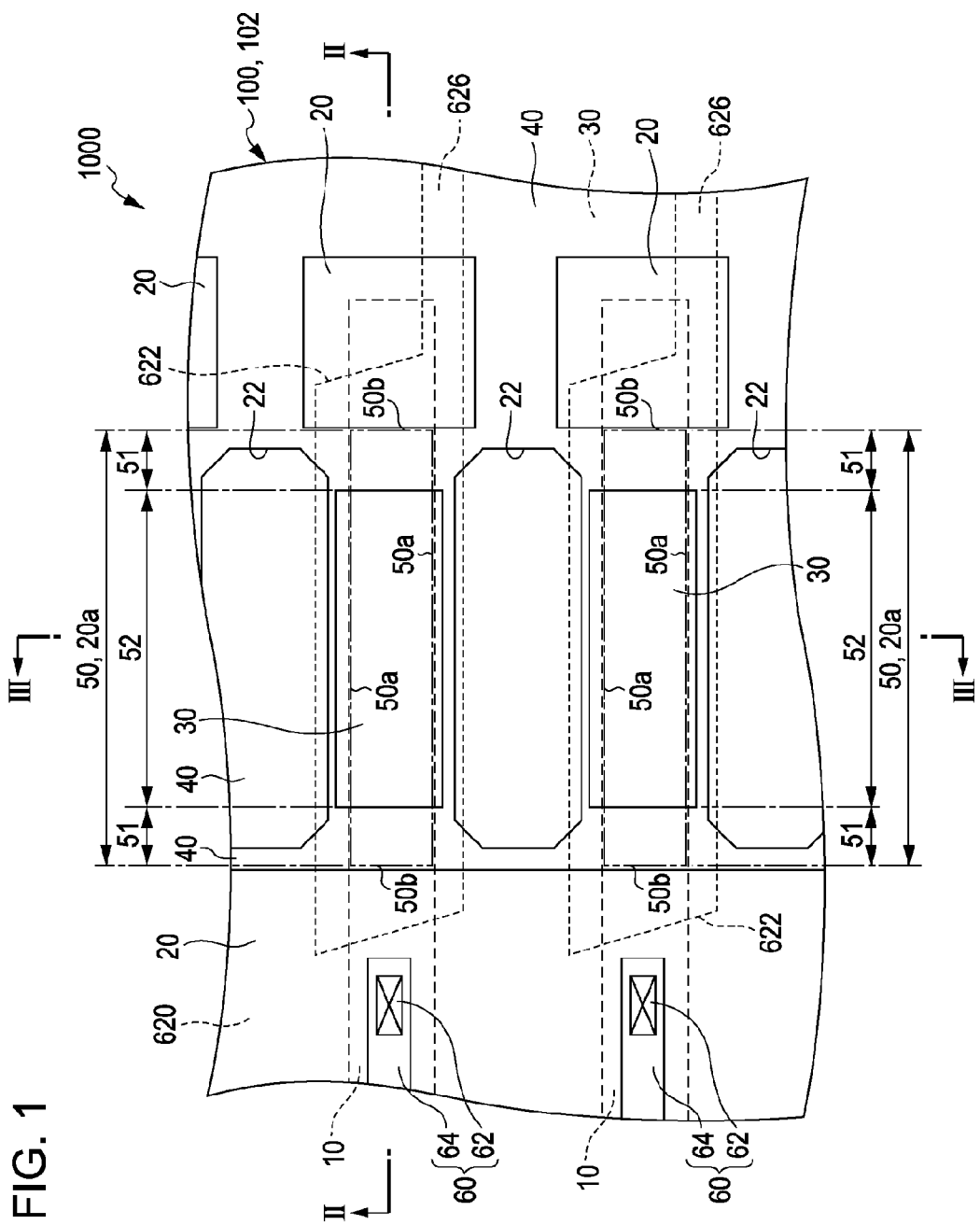
FIG. 1 is a plan view schematically illustrating part of a liquid-ejecting head of an embodiment.
Figure 2:
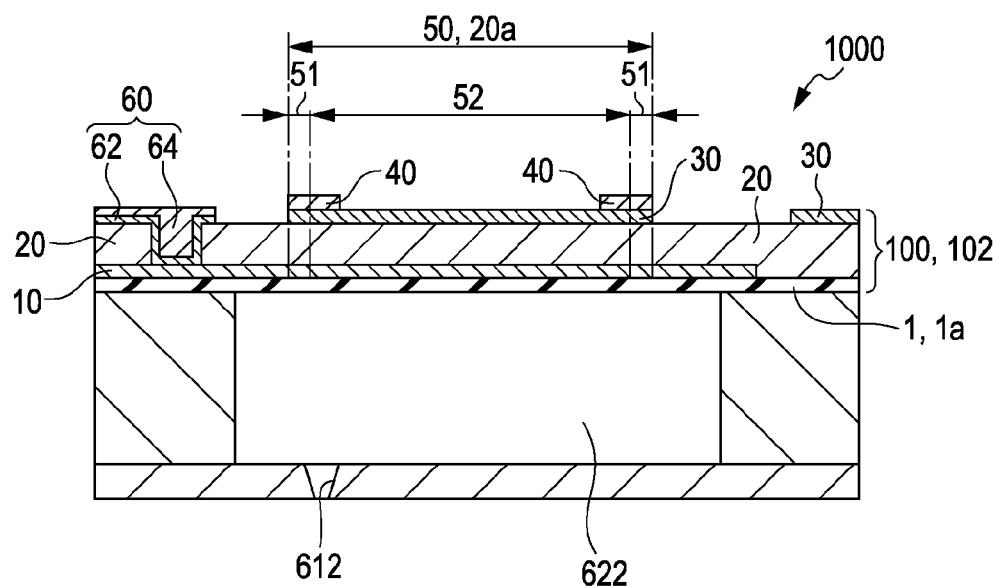
FIG. 2 is a cross-sectional view schematically illustrating part of the liquid-ejecting head of the embodiment.
Figure 3:
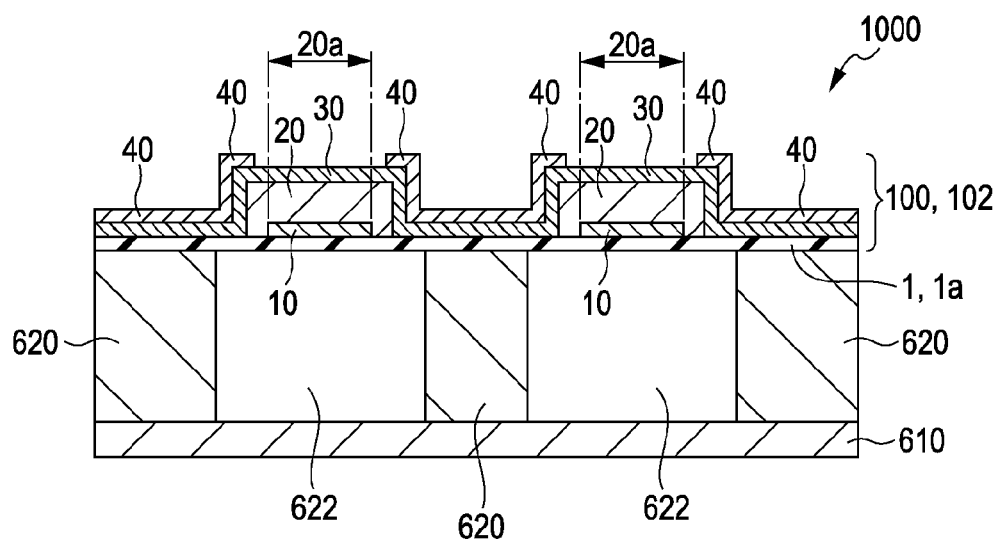
FIG. 3 is a cross-sectional view schematically illustrating part of the liquid-ejecting head of the embodiment.

FIG. 1 is a plan view schematically illustrating part of a liquid-ejecting head 1000 of this embodiment. FIG. 2 is a cross-sectional view schematically illustrating the liquid-ejecting head 1000 of this embodiment. FIG. 3 is another cross-sectional view schematically illustrating the liquid-ejecting head 1000 of this embodiment. In addition, FIG. 2 illustrates a cross-sectional surface taken along the line II-II in FIG. 1, and FIG. 3 illustrates a cross-sectional surface taken along the line III-III in FIG. 1.

The liquid-ejecting head 1000 of this embodiment at least has a piezoelectric device 100.

1.1 Piezoelectric Device

The piezoelectric device 100 has a substrate 1, a first electrode 10, a piezoelectric layer 20, a second electrode 30, and a coating layer 40. In the case where the substrate 1 has flexibility and functions as a vibrating plate (insulating layer) that can be deformed (bent) as a result of actuation of the piezoelectric layer 20, the piezoelectric device 100 serves as a piezoelectric actuator 102 that is vibrated.

1.1.1. Substrate

The substrate 1 has a planar shape. The substrate 1 can exhibit flexibility and may be provided in the form of a vibrating plate (insulating layer) that can be deformed (bent) as a result of actuation of the piezoelectric layer 20. In the case where the substrate 1 serves as a vibrating plate, examples of a material used for the substrate 1 include an inorganic oxide and inorganic nitride such as zirconium dioxide ($ZrO_2$), silicon nitride, silicon oxide, or aluminum oxide and include an alloy such as stainless steel. Among these, zirconium dioxide is an especially preferable material of the substrate 1 (vibrating plate) in terms of chemical stability and rigidity. The substrate 1 may have a structure in which two or more of the above materials are stacked.

A silicon substrate or a quartz substrate may be employed as the substrate 1. In this case, the substrate 1 is formed, for example, in a tuning fork-like shape, and the substrate 1 is oscillated as a result of actuation of the piezoelectric layer 20. Alternatively, a timing device can be configured, in which actuation of the substrate 1 is detected by utilizing the strain of the piezoelectric layer 20. In this case, several types of piezoelectric devices can be configured, such as an ultrasonic device, for example an ultrasonic oscillator; a device having a mechanical output, for example an ultrasonic motor; and a pressure sensor with which the stress applied to the substrate 1 and the deformation of the substrate 1 are detected by utilizing the strain or the like of the piezoelectric layer 20.

In this embodiment, the substrate 1 has flexibility and functions as a vibrating plate that serves as a wall surface of a pressure chamber of the liquid-ejecting head 1000. Accordingly, the actuation of the piezoelectric layer 20 enables the substrate 1 to be deformed with the result that the volume of the pressure chamber can be changed, thereby being able to eject a liquid from a nozzle hole of the liquid-ejecting head 1000.

1.1.2. First Electrode

The first electrode 10 is formed on the substrate 1. The first electrode 10 is covered with the piezoelectric layer 20 and is provided so as to have an area that forms a structure in which the piezoelectric layer 20 is positioned between such an area and the second electrode 30 that is formed on the piezoelectric layer 20. The first electrode 10 is formed on the substrate 1 but is not required to entirely cover the substrate 1. The first electrode 10 is provided in the form of a layer, a thin film, or a flat plate. For example, the first electrode 10 can be configured so as to have a thickness that is in the range from 20 nm to 60 nm. In the case where the first electrode 10 has a thickness smaller than 20 nm, the electrical conductivity of the first electrode 10 may fall into insufficiency.

Seeing the first electrode 10 in a plan view (in a direction normal to the substrate 1), the first electrode 10 has a shape with a long side. For example, the first electrode 10 has a rectangular shape in a planar view. In the case where the piezoelectric device 100 has a plurality of operable portions, the first electrode 10 can be used for individual electrodes thereof.

Seeing the first electrode 10 in a plan view, the first electrode 10 forms an overlap region 50 in which the first electrode 10 overlaps the second electrode 30. The overlap region 50 has a rectangular shape in a planar view. A long side 50a of the overlap region 50 is defined by a side, which is parallel to a length direction, of the first electrode 10.

In one of the functions of the first electrode 10, the first electrode 10 serves as either electrode provided to apply an electric field to the piezoelectric layer 20 (for example a lower electrode that is formed so as to underlie the piezoelectric layer 20).

Examples of a material used for the first electrode 10 include various types of metals such as nickel, iridium, and platinum; the conductive oxide thereof (for example, iridium oxide); a composite oxide of strontium and ruthenium (SrRuOx: SRO); and a composite oxide of lanthanum and nickel (LaNiOx: LNG). The first electrode 10 may have a single layer structure of any of the above exemplified materials or may have a structure in which several types of such materials are stacked.

For example, the first electrode 10 can be formed through vapor deposition, sputtering, or chemical vapor deposition (CVD). Then, a photolithographic technique or the like can be employed to form a pattern in the above shape. The first electrode 10 can be formed by a technique such as a printing or imprinting technique. In this case, the first electrode 10 can be directly formed on the substrate 1.

1.1.3. Piezoelectric Layer

The piezoelectric layer 20 is formed so as to cover the first electrode 10. In the case where the first electrode 10 is patterned, the piezoelectric layer 20 may be formed on the substrate 1. The piezoelectric layer 20 has a region that is positioned between the first electrode 10 and the second electrode 30. Such a region of the piezoelectric layer 20 is herein referred to as an active region 20a, where appropriate. In a plan view, the active region 20a of the piezoelectric layer 20 corresponds to the overlap region 50 in which the first electrode 10 overlaps the second electrode 30.

Although the piezoelectric layer 20 is formed so as to cover the first electrode 10 and has the active region 20a, a region (inactive region) other than the overlap region 50 (active region 20a) may have a portion in which the piezoelectric layer 20 is not formed. For example, with reference to FIG. 1, through-holes 22 are formed in the inactive regions of the piezoelectric layer 20. For example, the formation of the through-holes 22 in the piezoelectric layer 20 can contribute to suppressing the defective vibration of the substrate 1 caused by the piezoelectric layer 20.

In this embodiment, the piezoelectric layer 20 is formed so as to cover the first electrode 10, and the piezoelectric layer 20 can therefore protect the first electrode 10 from, for example, impurities that intrude from the outside.

Another layer may be formed between the first electrode 10 and the piezoelectric layer 20. Examples of such another layer include a titanium layer. In the example in FIG. 1, the piezoelectric layer 20 is formed so as to contact the first electrode 10. For example, the piezoelectric layer 20 can be configured so as to have a thickness that is in the range from 100 to 2000 nm. In the case where the thickness of the piezoelectric layer 20 falls within such a range, the sufficient deformation (electromechanical transduction) of the piezoelectric device 100 (piezoelectric actuator 102) can be secured. More preferably, the piezoelectric layer 20 has a thickness that is in the range from 1000 to 1500 nm. In the case where the thickness of the piezoelectric layer 20 falls within such a range, the piezoelectric device 100 can be deformed in a sufficiently large amount, and such a thickness can contribute to thinning the piezoelectric device 100.

The piezoelectric layer 20 is formed so as to primarily contain an oxide having a perovskite crystal structure and has piezoelectric properties. Examples of such an oxide having a perovskite crystal structure and used for the piezoelectric layer 20 include an oxide having a chemical composition represented by a general formula $M_A M_B O_3$ (in the general formula, an atom of an element corresponding to a site $M_A$ is coordinated to 12 oxygen atoms, and an atom of an element corresponding to a site $M_B$ is coordinated to six oxygen atoms). The oxide that is employed as the primary component of the piezoelectric layer 20 is not specifically limited as long as piezoelectric properties are exhibited. On the basis of the general formula $M_A M_B O_3$, preferable examples of such an oxide include an oxide which contains at least one element selected from the group consisting of lead, potassium, barium, strontium, and bismuth as the element corresponding to the site $M_A$ and which contains at least one element selected from the group consisting of zirconium, titanium, niobium, sodium, tantalum, and lanthanum as the element corresponding to the site $M_B$.

Among these, an oxide at least containing lead, zirconium, titanium, and oxygen is more preferably employed as the primary component of the material used for the piezoelectric layer 20. Specific examples of the oxide preferably employed as the primary component of the piezoelectric layer 20 include lead zirconate titanate [$Pb(Zr,Ti)O_3$] (hereinafter referred to as PZT in short, where appropriate) and lead zirconate titanate niobate [$Pb(Zr, Ti, Nb)O_3$] (hereinafter referred to as PZTN in short, where appropriate).

such oxides can form a solid solution containing an oxide of the element corresponding to the site $M_A$ and containing an oxide of the element corresponding to the site $M_B$. Such a composite oxide can be crystallized, thereby being able to have the perovskite crystal structure. Such an oxide has the perovskite crystal structure, thereby being able to exhibit the piezoelectric properties. Accordingly, the piezoelectric layer 20 can be deformed as a result of applying an electric field through the first electrode 10 and the second electrode 30 (namely, electromechanical transduction). The deformation of the piezoelectric layer 20 enables the piezoelectric device 100 to be deformed. Accordingly, for example, in the case where the substrate 1 serves as a vibrating plate, the substrate 1 can be deformed (bent) and can be vibrated.

The piezoelectric layer 20 may have a stack structure. For example, several layers including piezoelectric layers having different compositions or including piezoelectric layers having the same compositions may be stacked. Furthermore, the piezoelectric layer 20 may have a composition gradient in a thickness direction. Moreover, the number of the layers to be stacked is appropriately determined.

For example, the piezoelectric layer 20 can be formed by a thin film method such as: a sputtering method [including a direct current (DC) sputtering, ion sputtering, and magnetron sputtering method]; a vapor deposition method; a metalorganic chemical vapor deposition (MOCVD) method; a metal-organic decomposition (MOD) method; a pulsed laser deposition (PLD) method (for example, a laser ablation method); a misted deposition method; or a sol-gel method. For example, in the case where the piezoelectric layer 20 having a large thickness is formed by such a thin film method, the piezoelectric layer 20 can be formed as a result of securing long deposition time in an approach in which a material is deposited, such as the sputtering method, vapor deposition method, or MOCVD method. Alternatively, in the case where an approach in which coating and calcination are performed is employed, such as the MOD method or sol-gel method, such an approach is repeated to stack layers, thereby being able to form the piezoelectric layer 20. In the case where the layers are further stacked, different thin film methods may be employed for individual layers, thereby stacking the layers.

1.1.4. Second Electrode

The second electrode 30 is formed on the piezoelectric layer 20. The second electrode 30 is provided on the piezoelectric layer 20 but is not required to entirely cover he piezoelectric layer 20. In the case where the through-holes 22 or the likes are formed in the piezoelectric layer 20, the second electrode 30 may be formed, for example, on the substrate 1 at a portion at which the through-holes 22 or the likes are formed. The second electrode 30 is provided so as to have an area that forms a structure in which the piezoelectric layer 20 is positioned between such an area and the first electrode 10 that is covered with the piezoelectric layer 20. The second electrode 30 is provided in the form of a layer, a thin film, or a flat plate. For example, the second electrode 30 can be configured so as to have a thickness that is in the range from 20 nm to 300 nm. In the case where the second electrode 30 has a thickness smaller than 20 nm, the electrical conductivity of the second electrode 30 may fall into insufficiency.

Seeing the second electrode 30 in a plan view (in a direction normal to the substrate 1), the second electrode 30 forms an overlap region 50 in which the second electrode 30 overlaps the first electrode 10. The overlap region 50 has a rectangular shape in a plan view. A short side 50b of the overlap region 50 is defined by the second electrode 30. For example, the second electrode 30 has a rectangular shape in a plan view. In the case where the piezoelectric device 100 has a plurality of operable portions, the second electrode 30 can serve as a common electrode thereof.

In one of the functions of the second electrode 30, the second electrode 30 serves as either electrode provided to apply an electric field to the piezoelectric layer 20 (for example, an upper electrode that is formed so as to overlie the piezoelectric layer 20).

The same material as used for the first electrode 10 can be used for the second electrode 30. The second electrode 30 may have a single layer structure of any of the above exemplified materials or may have a structure in which several types of materials are stacked. Among the materials, iridium is employed as a primary component to form the second electrode 30, so that the electrical conductivity of the second electrode 30 becomes excellent, and an advantageous effect can be enhanced, in which the second electrode 30 protects the piezoelectric layer 20 from moisture or hydrogen that intrudes from the outside, for example.

For example, the second electrode 30 can be formed through vapor deposition, sputtering, or CVD. Then, a photolithographic technique or the like can be employed to form a pattern in the above shape. The second electrode 30 can be formed by a technique such as a printing or imprinting technique.

1.1.5. Overlap Region

As described above, the first electrode 10 and the second electrode 30 form the overlap region 50 in which the first electrode 10 overlaps the second electrode 30 in a plan view. The overlap region 50 has a rectangular shape in a plan view. In a plan view, the long side 50a of the rectangular overlap region 50 is defined by the first electrode 10, and the short side 50b is defined by the second electrode 30.

The overlap region 50 has a pair of first regions 51 that are provided adjacent to a pair of the short sides 50b. The first regions 51 are positioned at the two ends of the rectangular overlap region 50 in a length direction in a plan view. Namely, the first regions 51 are defined as regions other than the central portion of the rectangular overlap region 50 in a length direction in a plan view. In a plan view, each of the first regions 51 has an area that is larger than or equal to 2% and that is less than 98%, relative to the area of the overlap region 50. In view of more preferable balance between suppression of the deformation, which is generated at the boundary between the active region 20a and inactive region of the piezoelectric layer 20, and magnitude of the deformation of the active region 20a of the piezoelectric layer 20, each of the first regions 51 more preferably has an area that is larger than or equal to 10% and that is less than 80%, relative to the area of the overlap region 50 in a plan view.

The overlap region 50 has a second region 52 that is positioned between the pair of the first regions 51. The second region 52 includes the central portion of the rectangular overlap region 50 in a length direction in a plan view. Namely, the second region 52 is defined as a region other than the two ends of the rectangular overlap region 50 in a length direction in a plan view. In a plan view, the second region 52 has an area that is larger than or equal to 2% and that is less than 98%, relative to the area of the overlap region 50. In view of more preferable balance between suppression of the deformation, which is generated at the boundary between the active region 20a and inactive region of the piezoelectric layer 20, and magnitude of the deformation of the active region 20a of the piezoelectric layer 20, the second region 52 more preferably has an area that is larger than or equal to 20% and that is less than 90%, relative to the area of the overlap region 50 in a plan view.

1.1.6. Coating Layer

The coating layer 40 is formed on the second electrode 30. The coating layer 40 is provided so as to avoid the second region 52 of the overlap region 50 in a plan view. Furthermore, the coating layer 40 is formed at least in each of the first regions 51 of the overlap region 50 in a plan view. The coating layer 40 may be provided at another portion on the second electrode 30. The coating layer 40 is not required to be provided entirely in the other region on the second electrode 30 than the second region 52. The coating layer 40 can be configured so as to have a thickness that is, for example, in the range from 20 to 200 nm. The coating layer 40 is formed by using tungsten or titanium.

In one of the functions of the coating layer 40, in the case where an electric field is applied to the drive region (overlap region 50) of the piezoelectric layer 20 to generate the deformation, the coating layer 40 suppresses the deformation of the piezoelectric layer 20 positioned in the first regions 51. In another function of the coating layer 40, the coating layer 40 serves as an aid for the electrical conductivity of the second electrode 30.

The coating layer 40 is provided at the outer side from the long side 50a positioned in the second region 52 of the overlap region 50 in a plan view. Therefore, the coating layer 40 suppresses the deformation of the active region 20a of the piezoelectric layer 20 in a direction of the short side 50b in a small amount. Accordingly, the piezoelectric layer 20 can deform in a sufficiently large amount.

1.1.7. Other Configurations

The piezoelectric device 100 of this embodiment may have a lead electrode 60, the lead electrode 60 being formed on the piezoelectric layer 20 and being electrically connected to the first electrode 10.

The planar shape of the lead electrode 60 is not specifically limited as long as the lead electrode 60 is electrically connected to the first electrode 10 and is electrically isolated from the second electrode 30.

For example, the lead electrode 60 is formed as follows: a through-hole 20b is formed in the piezoelectric layer 20 so as to be in communication with the first electrode 10; a base layer 62 is formed inside the through-hole 20b and in a desired region on the piezoelectric layer 20 by using an alloy of nickel and chromium; and a lead electrode layer 64 is then formed on the base layer 62 as a result of, for example, stacking gold.

Although a material used for the lead electrode 60 is not specifically limited, the alloy of nickel and chromium is used to at least form the base layer 62 with the result that adhesion between the piezoelectric layer 20 and the lead electrode 60 can be increased.

In one of the functions of the lead electrode 60, electrical connection to the first electrode 10 can be formed on the piezoelectric layer 20 while a state in which the piezoelectric layer 20 covers the first electrode 10 is maintained. Accordingly, for example, an electrical connection between the first electrode 10 and an outside portion can be easily formed during a production process. By virtue of such a configuration, for example, the occupied area of the piezoelectric device 100 can be decreased in a plan view, thereby being able to improve the density of arrangement of nozzle holes 612 of the liquid-ejecting head 1000.

1.1.8. Characteristics of Piezoelectric Device

The piezoelectric device 100 (piezoelectric actuator 102) of this embodiment has the following characteristics.

In the piezoelectric device 100 of this embodiment, the coating layer 40 is made of tungsten or titanium. Tungsten or titanium is a material that exhibits a relatively high Young's modulus. The coating layer 40 made of such a material is formed on the first regions 51, so that the deformation of the piezoelectric layer 20 in the first regions 51 can be suppressed to a smaller level relative to the natural deformation amount. On the other hand, the coating layer 40 is not formed in the second region 52, and the deformation of the piezoelectric layer 20 in the second region 52 is not therefore suppressed, so that the deformation of the piezoelectric device 100 can be secured in a sufficiently large amount.

Meanwhile, stress generated in the piezoelectric layer 20 will be described. An electric field is applied through the first electrode 10 and the second electrode 30 with the result that the active region 20a of the piezoelectric layer 20 deforms, for example, in the manner of expansion and contraction. In this case, an electric field is not almost applied to regions, which are adjacent to the active region 20a, of the piezoelectric layer 20, and the deformation is not caused. Therefore, the deformation is restricted at a boundary with such regions, and stress is generated. The stress is generated when the active region 20a expands and contracts in a plane of the piezoelectric layer 20, and stress having a piezoelectric layer 20-pulling component is generated especially in the case where active region 20a contracts. In the case where the stress is increased to a certain magnitude or larger, cracking occurs at a boundary between the active region 20a and inactive region of the piezoelectric layer 20. Because the active region 20a (overlap region 50) has a long side, such cracking is likely to occur at an end of the active region 20a in a length direction (position parallel to the short side 50b of the overlap region 50) before cracking occurs at other portions, such an end having an increased expansion component.

Meanwhile, the stress that causes cracking in the piezoelectric layer 20 depends on an amount in which the deformation is restricted. Specifically, in the case where the deformation is restricted in large amounts, the stress is generated in larger amounts. Accordingly, the larger difference in the deformation amount between adjacent regions in the piezoelectric layer 20 becomes, the larger stress is generated. In contrast, the difference in the deformation amount between adjacent regions in the piezoelectric layer 20 is decreased, thereby being able to decrease the amount of the stress to be generated.

In the piezoelectric device 100 of this embodiment, the coating layer 40 is formed in the first regions 51 that are positioned so as to correspond to ends of the active region 20a in a length direction. Therefore, the coating layer 40 can serve to suppress the deformation of the ends of the active region 20a in a length direction to a smaller level relative to the natural deformation amount. Accordingly, an amount in which the deformation generated at the boundary between the active region 20a and the inactive region is restricted can be decreased, and the stress generated at such a boundary can be decreased. Consequently, the piezoelectric device 100 of this embodiment has an advantage in which the formation of the coating layer 40 enables the stress generated in the piezoelectric layer 20 to be suppressed and in which breaking such as cracking is therefore less likely to be caused in the piezoelectric layer 20.

Each of tungsten and titanium used as a material of the coating layer 40 has standard electrode potential close to that of each of nickel and chromium. Specifically, standard electrode potential in each of reactions of $WO_2+4H^++4e^-\longleftrightarrow W+2H_2O$ and $W_2O_5+2H^++2e^-\longleftrightarrow W+2H_2O$ is $-0.119$ V, standard electrode potential in a reaction of $Ti^{2+}+2e^-\longleftrightarrow Ti$ is $-1.63$ V, and standard electrode potential in a reaction of $Ti^{3+}+e^-\longleftrightarrow Ti^{2+}$ is $-0.360$ V. On the other hand, standard electrode potential in a reaction of $Ni^{2+}+2e^-\longleftrightarrow Ni$ is $-0.257$ V, and standard electrode potential in a reaction of $Cr^{2+}+2e^-\longleftrightarrow Cr$ is $-0.9$ V.

Meanwhile, standard electrode potential in a reaction of $Ir^{3+}+3e^-\longleftrightarrow Ir$ is $+1.156$ V.

In the case of a configuration in which the lead electrode 60 containing nickel and chromium is provided and in the case where wet etching is required to be performed for process reasons, the coating layer 40 is provided on the second electrode 30, thereby being able to suppress galvanic corrosion of nickel or chromium to a reduced amount, such galvanic corrosion being caused by etchant. Namely, in the case where the coating layer 40 is not formed, iridium that exhibits high standard electrode potential and each of nickel and chromium that exhibits low standard electrode potential are immersed into the etchant in such an etching process, and an electrochemical reaction is likely to be caused. In contrast, the piezoelectric device 100 of this embodiment has the following advantage: in a configuration in which the lead electrode 60 containing nickel and chromium is provided, the formation of the coating layer 40 can contribute to decreasing an area in which iridium contacts the etchant. Furthermore, in such an advantage, iridium is covered with tungsten or titanium having standard electrode potential close to that of each of nickel and chromium, such an electrochemical reaction is therefore suppressed, and galvanic corrosion of nickel and chromium is accordingly less likely to be caused.

1.2. Other Configurations

The liquid-ejecting head 1000 of this embodiment has the piezoelectric device 100, a vibrating plate 1a, a pressure chamber substrate 620, and a nozzle plate 610. Use of vibrating plate 1a for the liquid-ejecting head 1000 corresponds to the case in which the substrate 1 serves as a vibrating plate as described with respect to the piezoelectric device 100. In FIG. 1, illustration of the nozzle plate 610 is omitted.

The nozzle plate 610 has a nozzle hole 612. The nozzle hole 612 is capable of ejecting ink. For example, a plurality of the nozzle holes 612 are formed in the nozzle plate 610 in line (see, FIG. 4). Examples of a material used for the nozzle plate 610 include silicon and steel used stainless (SUS).

Figure 4:
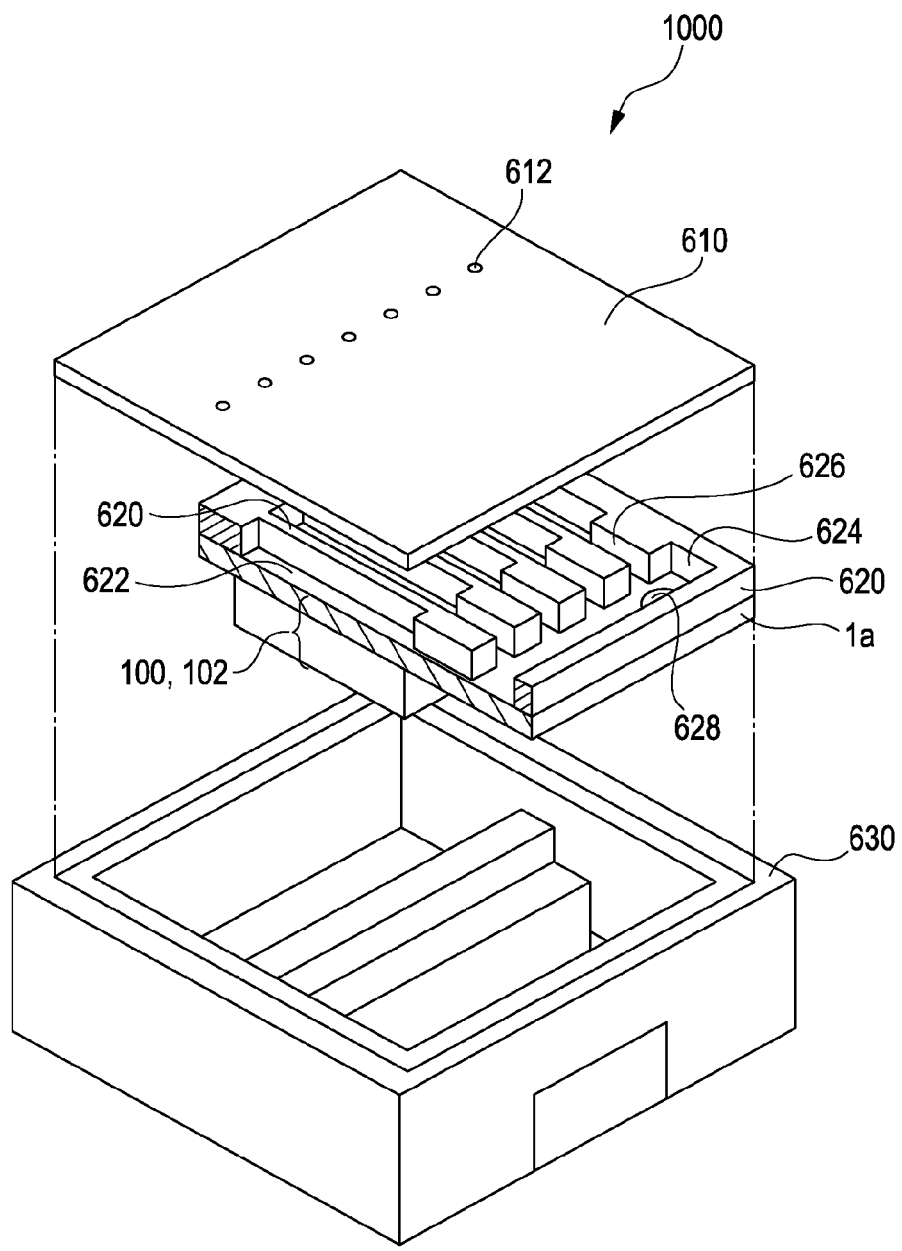
FIG. 4 is an exploded perspective view illustrating the liquid-ejecting head of the embodiment.

The pressure chamber substrate 620 is disposed so as to overlie the nozzle plate 610 (underlying the nozzle plate 610, in FIG. 4). Examples of a material used for the pressure chamber substrate 620 include silicon. The pressure chamber substrate 620 defines a space between the nozzle plate 610 and the vibrating plate 1a, and the liquid-ejecting head 1000 is therefore provided with a reservoir (liquid-reserving section) 624, a feed opening 626 connected to the reservoir 624, and the pressure chamber 622 connected to the feed opening 626 as illustrated in FIG. 4. The reservoir 624, the feed opening 626, and the pressure chamber 622 are flow channels of the liquid. Although the flow channels are individually described in this embodiment, they may be designed in any manner. In addition, for example, although part of the flow channels is narrowed to form the feed opening 626 in the illustration, such a configuration is not indispensable, and the feed opening 626 may be formed on the basis of an appropriate design. The reservoir 624, the feed opening 626, and the pressure chamber 622 are defined by the nozzle plate 610, the pressure chamber substrate 620, and the vibrating plate 1a. The reservoir 624 is capable of temporarily reserving an ink that is supplied from the outside (an ink cartridge, for example) through a thorough-hole 628 formed in the vibrating plate 1a. The ink inside the reservoir 624 can be supplied to the pressure chamber 622 through the feed opening 626. The vibrating plate 1a is deformed, and the volume of the pressure chamber 622 is therefore changed. The pressure chamber 622 is connected to the nozzle hole 612. The volume change in the pressure chamber 622 enables ink or the like to be ejected from the nozzle hole 612.

The piezoelectric device 100 is disposed so as to overlie the pressure chamber substrate 620 (underlying the pressure chamber substrate 620, in FIG. 4). The piezoelectric device 100 can be electrically connected to a piezoelectric device-driving circuit (not illustrated) and can be actuated on the basis of a signal transmitted from the piezoelectric device-driving circuit. The vibrating plate 1a is deformed depending on the action of the piezoelectric device 100 and is therefore capable of appropriately changing the inner pressure of the pressure chamber 622.

With reference to FIG. 4, a housing 630 is capable of accommodating the nozzle plate 610, the pressure chamber substrate 620, and the piezoelectric device 100. Examples of a material used for the housing 630 include resin and metal.

The liquid-ejecting head 1000 has the piezoelectric device 100. Accordingly, breaking such as cracking is not less likely to be caused in the piezoelectric layer 20, and high reliability is therefore provided.

For example, the liquid-ejecting head 1000 of this embodiment can be preferably utilized for the following applications: a recording head used for an image-recording apparatus such as a printer; a color material-ejecting head used for manufacturing a color filter of a liquid crystal display or the like; a liquid material-ejecting head used for forming an electrode or color filter of an organic electro-luminescence (EL) display, field emission display (FED), electrophoretic display, or the like; and a living-organic material-ejecting head used for manufacturing a biochip.

In the above description, an example of the piezoelectric device (piezoelectric actuator) of embodiments of the invention has been provided, in which the substrate 1 is provided in the form of the vibrating plate 1a that is deformed in the manner of, for example, bending. Examples of the piezoelectric device (piezoelectric actuator) of embodiments of the invention include other types of piezoelectric devices including: a timing device in which the substrate 1 is provided in the form of a vibration piece having a tuning fork-like shape; an ultrasonic device such as an ultrasonic oscillator in which the substrate 1 is vibrated in a frequency of an ultrasonic range to generate ultrasonic wave; a device having a mechanical output, such as an ultrasonic motor in which the substrate 1 is vibrated in a frequency of an ultrasonic range to drive another component; and a pressure sensor which detects the stress applied to the substrate 1 and the deformation of the substrate 1.

2. Liquid-ejecting Apparatus

Figure 5:
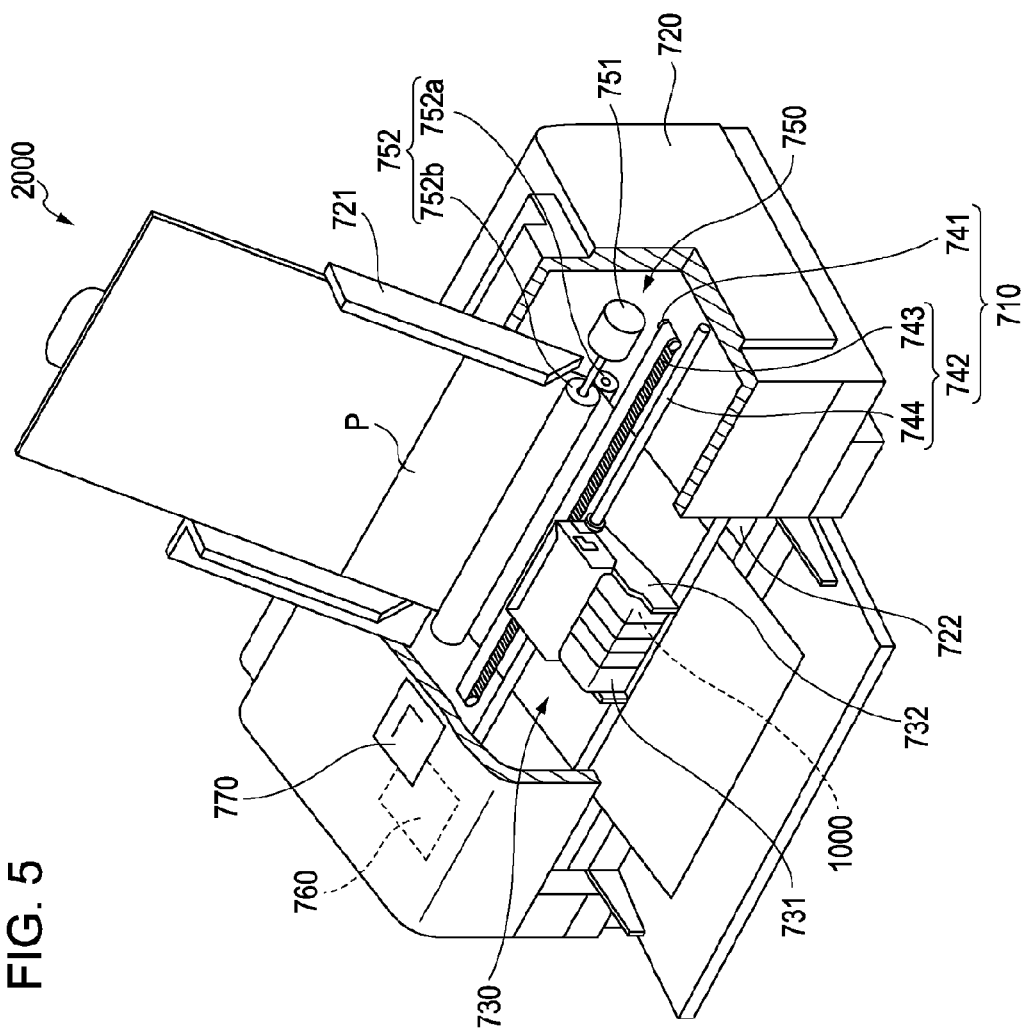
FIG. 5 is a perspective view illustrating a liquid-ejecting apparatus of an embodiment.

FIG. 5 is a perspective view schematically illustrating a liquid-ejecting apparatus 2000.

With reference to FIG. 5, the liquid-ejecting apparatus 2000 includes a head unit 730, a driving section 710, and a control section 760. Furthermore, the liquid-ejecting apparatus 2000 is capable of including an apparatus body 720, a paper feed section 750, a paper feed tray 721 on which recording paper P is placed, an ejection opening 722 through which the recording paper P is ejected, and an operation panel 770 disposed at an upper surface of the apparatus body 720.

The head unit 730 has the liquid-ejecting head 1000 (hereinafter referred to as "head", simply). Furthermore, the head unit 730 has an ink cartridge 731 which supplies ink to the head and has a transporting unit (carriage) 732 on which the head and the ink cartridge 731 are mounted.

The driving section 710 enables the head unit 730 to be reciprocated. The driving section 710 has a carriage motor 741 that serves as a driving source of the head unit 730 and has a reciprocating mechanism 742 that reciprocates the head unit 730 by receiving the rotation of the carriage motor 741.

The reciprocating mechanism 742 includes a carriage guide shaft 744 of which two ends are supported by a frame (not illustrated) and includes a timing belt 743 extending in parallel with the carriage guide shaft 744. The carriage 732 is supported by the carriage guide shaft 744 so as to be able to be reciprocated. Furthermore, the carriage 732 is fixed to part of the timing belt 743. The carriage motor 741 is operated to work the timing belt 743, and the head unit 730 is therefore reciprocated while being guided by the carriage guide shaft 744. During the reciprocation, ink is appropriately ejected from the head to perform printing to the recording paper P.

In this embodiment, although printing is performed while the liquid-ejecting head 1000 and the recording paper P are moved, the liquid-ejecting apparatus of embodiments of the invention may have a configuration in which printing is performed to the recording paper P while the liquid-ejecting head 1000 and the recording paper P relatively change positions each other. Furthermore, although printing is performed to the recording paper P in this embodiment, a recording medium to which printing can be performed by the liquid-ejecting apparatus of embodiments of the invention is not limited to paper. Examples of such a medium variously include cloth, a film, and metal, and the configuration of the apparatus may be appropriately changed.

The control section 760 is capable of controlling the head unit 730, the driving section 710, and the paper feed section 750.

The paper feed section 750 is capable of transporting the recording paper P from the paper feed tray 721 toward the head unit 730. The paper feed section 750 includes a paper feed motor 751 that serves as a driving source thereof and includes a paper feed roller 752 that rotates by the operation of the paper feed motor 751. The paper feed roller 752 includes a driven roller 752a and a driving roller 752b, and the driving roller 752b is disposed above the driven roller 752a so as to face each other while a transport path of the recording paper P is interposed therebetween. The driving roller 752b is connected to the paper feed motor 751. The control section 760 drives the paper feed section 750, and then the recording paper P is transported so as to pass below the head unit 730.

The head unit 730, the driving section 710, the control section 760, and the paper feed section 750 are provided inside the apparatus body 720.

The liquid-ejecting apparatus 2000 has the liquid-ejecting head 1000. Therefore, excellent reliability is provided.

The above exemplified liquid-ejecting apparatus 2000 has a single liquid-ejecting head 1000, and the liquid-ejecting head 1000 can function to perform printing to a recording medium. However, a plurality of the liquid-ejecting heads may be provided. In the case where the liquid-ejecting apparatus includes the plurality of the liquid-ejecting heads, the liquid-ejecting heads may be individually operated in the above manner, or the liquid-ejecting heads may be connected to each other to form an integrated head. An example of such an integrated head includes a line-type head in which individual nozzle holes of the heads are overall positioned so as to be spaced at a uniform distance.

Although the liquid-ejecting apparatus 2000 that serves as an ink jet printer has been described as an example of the liquid-ejecting apparatus having the liquid-ejecting head with the piezoelectric device (piezoelectric actuator) of embodiments of the invention, the liquid-ejecting apparatus of embodiments of the invention may be also applied to industrial use. In this case, various functional materials that are prepared with a solvent or a dispersion medium so as to have appropriate viscosity may be used as liquid or the like (liquid material) to be ejected. The liquid-ejecting apparatus of embodiments of the invention can be preferably applied not only to the exemplified image-recording apparatus, such as a printer, but also to a color material-ejecting apparatus used for manufacturing a color filter of a liquid crystal display or the like; a liquid material-ejecting apparatus used for forming an electrode and color filter of an organic EL display, FED, electrophoretic display, or the like; and a living-organic material-ejecting apparatus used for manufacturing a biochip.

3. Experimental Example

An experimental example will be hereinafter described for the purpose of more detailed description of embodiments of the invention. Embodiments of the invention are not limited to the following experimental example at all.

3.1. Computer Experiment

An infinite element method was employed to evaluate shear strain that was generated at the boundary between the active region 20a and inactive region of the piezoelectric layer 20 as described in the above embodiments.

In a model to be evaluated by the infinite element method, the first electrode 10 was formed by using platinum so as to have a thickness of 200 nm, a PZT layer (piezoelectric layer) was then formed on the first electrode 10 so as to have a thickness of 1000 nm, and the second electrode 30 was then formed on the PZT layer by using iridium so as to have a thickness of 50 nm. The overlap region 50 is configured so as to have the long side 50a with a length of 500 μm and so as to have the short side 50b with a length of 100 μm. The planar shape of the coating layer 40 was designed so as to cover the inner side of the overlap region 50 in an area of 50 μm from the short side 50b. In this experimental example, tungsten was employed as a material used for the coating layer 40.

In the infinite element method, a Young's modulus was designed in each of the materials as follows: 300 Gpa in iridium, 210 Gpa in tungsten, and 75 Gpa in PZT. A Poisson's ratio in each of iridium and tungsten was designed to be 0.3.

The thickness of the coating layer 40 was varied from 0 to 150 nm, and shear strain generated when the piezoelectric layer 20 was actuated was calculated. Meanwhile, provided that PZT was strained in the manner of contraction in an in-plane direction, shear strain generated when the piezoelectric layer 20 was contracted by 0.00376% was obtained in each calculation.

Figure 6:
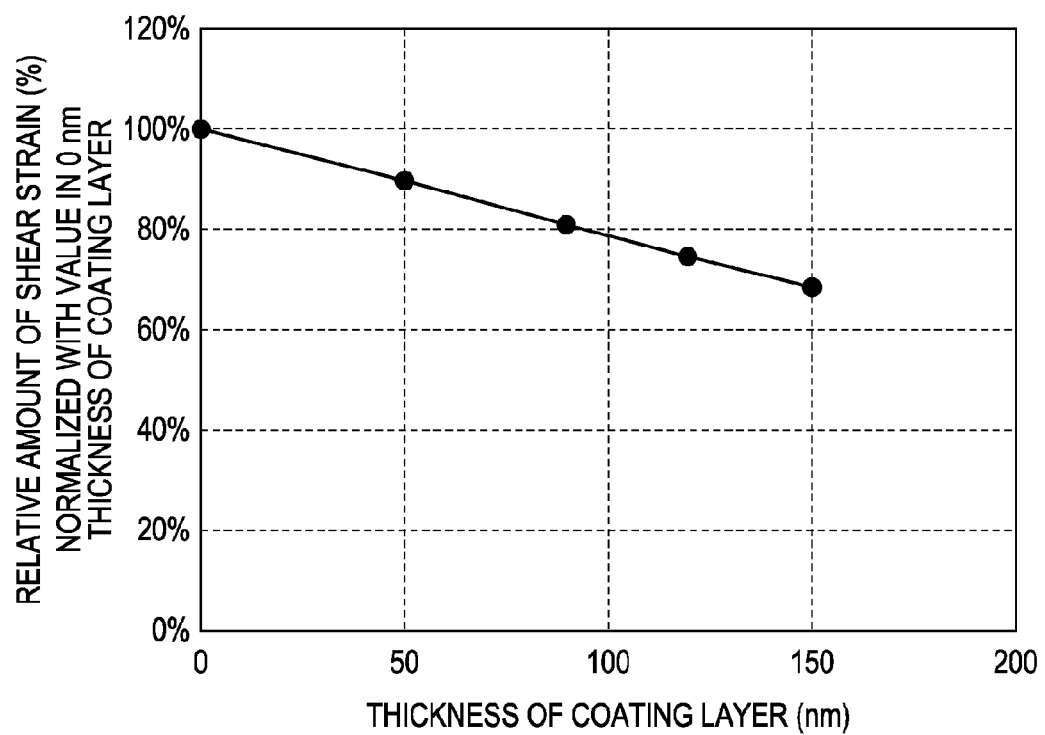
FIG. 6 is a graph illustrating results of simulation of relationship between the thickness and strain of a coating layer.

The results were illustrated in FIG. 6. In FIG. 6, the lateral axis indicates the thickness of the coating layer 40, and the longitudinal axis indicates the relative amount of the shear strain, such a relative amount being normalized assuming that the shear strain of the coating layer 40 with a thickness of 0 nm was 1 (100%).

With reference to FIG. 6, it was found that the thickness of the coating layer 40 was increased accompanying the decrease of shear strain generated at the boundary between the active region 20a and inactive region of the piezoelectric layer 20. From this result, it was proved that the formation of a coating layer 40 on a second electrode 30 could contribute to suppressing the stress generated at the boundary between the active region 20a and inactive region of the piezoelectric layer 20.

3.2. Electron Microscope Observation

Figure 7:
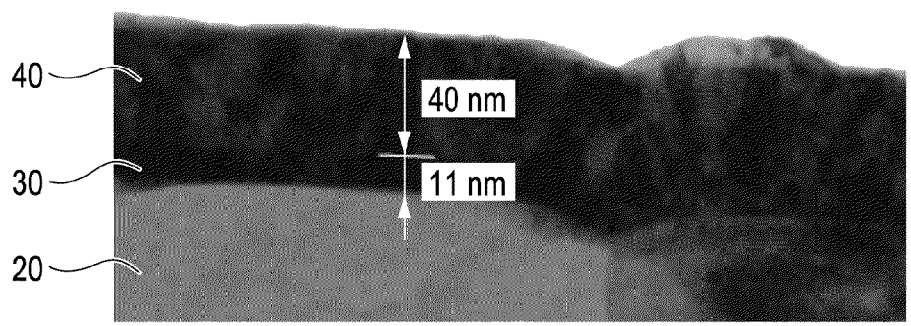
FIG. 7 illustrates an example of a cross-sectional surface of the coating layer micrographed using a transmission electron microscope.
Figure 8:
FIG. 8 illustrates another example of a cross-sectional surface of the coating layer micrographed using a transmission electron microscope.

FIGS. 7 and 8 illustrate specimens which were micrographed using a transmission electron microscope and in which a tungsten layer and a titanium layer were respectively formed as the coating layer 40 on the second electrode 30 (iridium) provided on the piezoelectric layer (PZT).

With reference to FIGS. 7 and 8, in each of the specimens, the coating layer 40 was uniformly formed on the second electrode 30 without the occurrence of a defect such as generation of a gap. Such a result indicated that each of the piezoelectric layer 20, second electrode 30, and coating layer 40 had excellent adhesion. Accordingly, it was considered that an advantage was provided, in which the coating layer 40 could contribute to suppressing the strain generated in the piezoelectric layer 20.

The above embodiments or the likes can be appropriately combined with arbitrary embodiments. Accordingly, the combined embodiments can exhibit the effects of individual embodiments or can generate a synergistic effect.

Embodiments of the invention are not limited to the above embodiment and can be variously modified. For example, embodiments of the invention include configurations substantially the same as those described in the above embodiments (for example, configurations having the same functions, processes, and results or having the same objects and advantageous effects as those in the above embodiments). In addition, embodiments of the invention may include configurations provided by changing non-essential parts of the configurations described in the above embodiments. Furthermore, embodiments of the invention may include configurations that can provide effects the same as those described in the above embodiments or that can provide advantages the same as those described in the above embodiments. Still furthermore, embodiments of the invention may include configurations in which at least one well-known technique is added to the configurations described in the above embodiments.

What is claimed is:

1. A piezoelectric device comprising:
a first electrode;
a piezoelectric layer that is formed above the first electrode;
a second electrode that is formed above the piezoelectric layer;
a coating layer that is formed above the second electrode consisting of titanium, and
a lead electrode that is formed on the piezoelectric layer so as to be electrically connected to the first electrode, the lead electrode containing nickel and chromium,
wherein the first electrode and the second electrode form a rectangular overlap region in which the first electrode overlaps the second electrode in a plan view, the first electrode defining a long side of the overlap region and the second electrode defining a short side of the overlap region, the overlap region having a pair of first regions and having a second region, the pair of the first regions being positioned adjacent to a pair of the short sides, and the second region being positioned between the pair of the first regions,
wherein the coating layer is formed at least in the first regions so as to avoid the second region of the overlap regions.

2. The piezoelectric device according to claim 1, wherein a material used for the second electrode primarily contains iridium.

3. A liquid-ejecting apparatus having a piezoelectric device, the piezoelectric device comprising:
a first electrode;
a piezoelectric layer that is formed above the first electrode;
a second electrode that is formed above the piezoelectric layer;
a coating layer that is formed above the second electrode consisting of titanium, and
a lead electrode that is formed on the piezoelectric layer so as to be electrically connected to the first electrode, the lead electrode containing nickel and chromium,
wherein the first electrode and the second electrode form a rectangular overlap region in which the first electrode overlaps the second electrode in a plan view, the first electrode defining a long side of the overlap region and the second electrode defining a short side of the overlap region, the overlap region having a pair of first regions and having a second region, the pair of the first regions being positioned adjacent to a pair of the short sides, and the second region being positioned between the pair of the first regions,
wherein the coating layer is formed at least in the first regions so as to avoid the second region of the overlap regions.

* * * * *